(12) United States Patent
Veedu et al.

(10) Patent No.: US 7,763,187 B1
(45) Date of Patent: *Jul. 27, 2010

(54) CARBON NANOTUBES-REINFORCED CONDUCTIVE SILVER INK

(75) Inventors: Vinod P. Veedu, Honolulu, HI (US); Christopher J. Sullivan, Honolulu, HI (US)

(73) Assignee: Oceanit Laboratories, Inc., Honolulu, HI (US)

( * ) Notice: Subject to any disclaimer, the term of this patent is extended or adjusted under 35 U.S.C. 154(b) by 7 days.

This patent is subject to a terminal disclaimer.

(21) Appl. No.: 11/895,170

(22) Filed: Aug. 23, 2007

(51) Int. Cl.
*H01B 1/22* (2006.01)
*H01B 1/24* (2006.01)

(52) U.S. Cl. .................. 252/503; 252/510; 252/511

(58) Field of Classification Search ............ 252/503, 252/510, 511; 977/777, 735, 742
See application file for complete search history.

(56) References Cited

U.S. PATENT DOCUMENTS

| | | | |
|---|---|---|---|
| 7,144,624 B2 * | 12/2006 | Knowles et al. | 428/364 |
| 2003/0151030 A1 * | 8/2003 | Gurin | 252/502 |
| 2004/0017141 A1 * | 1/2004 | Cheng et al. | 313/311 |
| 2004/0021131 A1 * | 2/2004 | Blanchet-Fincher et al. | 252/500 |
| 2004/0242792 A1 * | 12/2004 | Sotzing | 525/326.1 |
| 2006/0186384 A1 * | 8/2006 | Gerhardt et al. | 252/511 |
| 2007/0142548 A1 * | 6/2007 | Nejhad et al. | 524/847 |
| 2008/0085410 A1 * | 4/2008 | Simone et al. | 428/355 CP |

OTHER PUBLICATIONS

Dresselhaus et al., "Carbon Nanotubes", Physicsworld.com, 1-10 (Jan. 1, 1998).*

* cited by examiner

*Primary Examiner*—Douglas Mc Ginty
(74) *Attorney, Agent, or Firm*—James Creighton Wray; Meera P. Narasimhan

(57) ABSTRACT

Conductive silver ink is reinforced using carbon nanotubes. Carbon nanomaterials are stabilized and uniformly dispersed in a solvent and mechanically mixed with conductive silver ink. The reinforcement material bridges the gap between separated silver flakes in the conductive silver ink. The carbon nanotubes reinforced conductive silver ink exhibits superior performance over unreinforced silver ink in its mechanical, electrical and thermal properties without significantly greater weight.

10 Claims, 1 Drawing Sheet

CARBON NANOTUBES-REINFORCED CONDUCTIVE SILVER INK

FIELD OF THE INVENTION

This invention applies to conductive ink, conductive coatings used in membrane switch circuitry, surface mount assemblies, coating of film capacitors and conductive coatings and printed circuits.

BACKGROUND OF THE INVENTION

The prior art conductive silver ink using thermoplastic one component urethane is typified by Conductive Ink, U.S. Pat. No. 4,369,269.

Conductive adhesives technology has many exciting advantages: they are compatible with a wide range of surfaces (including those that are non-solderable), have low thermal stress during processing, wide processing latitude, easy process control, and they demand only minor pre-clean or post-clean requirements. However, in general, conductive adhesives suffer due to lower mechanical strength and fatigue life and higher electrical and thermal resistance.

Needs exist for improved conductive inks and coating with improved conductivity and adhesion, mechanical and fatigue properties.

SUMMARY OF THE INVENTION

The invention provides ductile high strength silver ink with high conductivity, mechanical strength and durability.

Companies such as Dupont, 3M, Shell Coatings, EMERSON & CUMMING, MSI Inc., Epoxies.com, HOANA Medical have pursued the use of conductive silver ink for various applications.

The invention solves the problems of lack of mechanical strength and fatigue life for conductive silver ink.

The invention has specific improvements because this invention solves the problem of lack of mechanical strength and fatigue life for conductive coatings and patented conductive coatings without significant additional weight of materials.

The present invention reinforces conductive silver ink with carbon nanotubes (single walled, multiple walled, functionalized, as prepared or purified). Theoretically, metallic nanotubes can have an electrical current density more than 1,000 times greater than metals such as silver and copper. Moreover, carbon nanotubes exhibit extraordinary mechanical properties—the Young's modulus is over 1000 Giga Pascal and the estimated tensile strength is 200 Giga Pascal. These properties are ideal for improving the electro-mechanical performances of nanocomposites in general and silver conductive inks in particular. In the present invention, the carbon nanotubes are uniformly dispersed in the silver ink using a dispersion process by means of a solvent.

These and further and other objects and features of the invention are apparent in the disclosure, which includes the above and ongoing written specification, with the drawings.

DETAILED DESCRIPTION OF THE PREFERRED EMBODIMENTS

A preferred embodiment of the present invention uses polymer based conductive silver ink containing, generally: polymer, silver flakes and solvent. The polymer may be either thermosetting or thermoplastic. The polymer may be either one part or multiple part co-polymer. The silver content in the silver ink may vary from 2% to 95%. The silver flakes size could vary from 1 nm-100 micron.

First, carbon nanotubes are dispersed in a solvent (acetone, glycol ethers, acetates or alcohol) and sonicated. This nanotube dispersed solvent is then added to the conductive silver ink and mechanically stirred. The carbon nanotube weight fraction in the resulting mixture may vary from 0.00001% to 80% by weight. The resulting mixture remains stable and uniformly dispersed for more than two months.

Figure 1A:
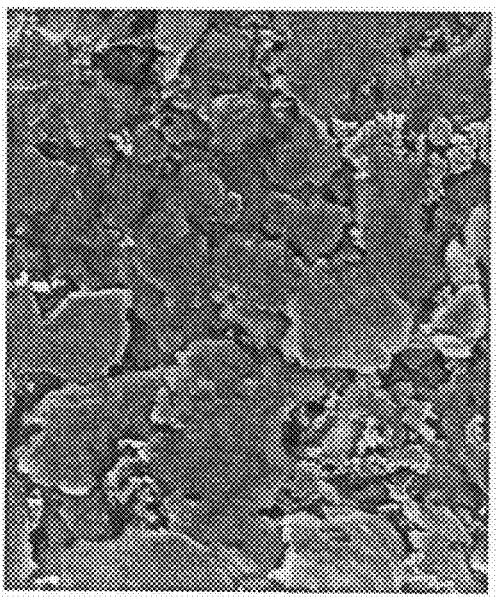
FIG. 1a is a scanning electron micrograph (SEM) of unreinforced conductive silver.
Figure 1B:
FIG. 1b is an SEM of carbon nanotube "stitching" of silver flakes in reinforced conductive silver ink.

Due to mechanical deterioration, the micron sized silver flakes in conductive silver ink separate as shown in FIG. 1a. By reinforcing with carbon nanotubes (CNTs), the nanotubes in effect "bridge" the gap between the silver flakes as shown in FIG. 1b. This CNT reinforcement results in improved mechanical, electrical and thermal properties of the conductive silver ink. The carbon nanotubes in the new conductive silver ink provide higher mechanical strength, longer life under stress and fatigue, higher electrical conductivity and lower thermal resistance.

In alternative embodiments, other nanoparticles such as buckyballs and grapheme may be used with or instead of carbon nanotubes as reinforcement materials. This process may also be used to reinforce matrix materials other than conductive silver ink.

While the invention has been described with reference to specific embodiments, modifications and variations of the invention may be constructed without departing from the scope of the invention.

We claim:

1. A conductive silver ink material, comprising:
a conductive ink having silver flake particles, a polymer and a solvent, and
a reinforcement and conductive material having at least one dimension of about 100 nm or less dispersed within the conductive ink,
wherein the silver content is 2% to 95% on the basis of the weight of the conductive silver ink material,
wherein the solvent is volatile,
wherein the reinforcement material comprises at least one nanoparticle selected from the group consisting of carbon nanotubes, buckyballs, and graphene,
wherein the reinforcement material is present in a concentration between approximately 0.00001% to 80% on the basis of the weight of the conductive silver ink material so as to improve strength, toughness and higher electrical conductivity and lower thermal resistance, resulting in improved mechanical, electrical and thermal properties of the material.

2. The material of claim 1, wherein the reinforcement material causes an increase in durability and ultimate strength compared to unreinforced silver ink.

3. A method of producing the conductive silver ink material of claim 1 comprising:
providing the conductive silver ink having silver flake particles, the polymer and the solvent,
providing carbon nanotubes,
adding the carbon nanotubes to the solvent,
subjecting the solvent-nanotube mixture to a sonication treatment, and adding the solvent-nanotube mixture to the conductive silver ink, providing conductive and reinforcement material to provide higher mechanical strength and longer life under stress and fatigue, higher electrical conductivity and lower thermal resistance, resulting in improved mechanical, electrical and thermal properties of the conductive silver ink material.

4. The method of claim 3, wherein the solvent comprises acetone, glycol ethers, acetates, or alcohol.

5. The material of claim 1, wherein the conductive silver ink comprises silver flakes and an adhesive, and the reinforcement material conductively bridges gaps between separate silver flakes.

6. The material of claim 1, wherein the reinforcement material comprises carbon nanotubes and the conductive ink is ductile and superior to unreinforced silver ink in its mechanical strength, fatigue life, electrical conductivity, and thermal resistance without significantly increased weight.

7. The material of claim 1, wherein the polymer is thermosetting or thermoplastic and is one-part or a multiple-part co-polymer.

8. The method of claim 3, further comprising mechanically stirring the carbon nanotubes and the solvent into the conductive particles in the polymer.

9. The method of claim 3, wherein the conductive particles are silver flakes from 1 nm to 100 microns in size.

10. The method of claim 1, wherein the solvent comprises acetone, glycol ethers, acetates, or alcohol.

* * * * *